United States Patent [19]
Weling et al.

[11] Patent Number: 5,965,941
[45] Date of Patent: *Oct. 12, 1999

[54] USE OF DUMMY UNDERLAYERS FOR IMPROVEMENT IN REMOVAL RATE CONSISTENCY DURING CHEMICAL MECHANICAL POLISHING

[75] Inventors: Milind G. Weling; Subhas Bothra, both of San Jose; Calvin T. Gabriel, Cupertino, all of Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/734,501

[22] Filed: Oct. 21, 1996

Related U.S. Application Data

[62] Division of application No. 08/593,900, Jan. 30, 1996, Pat. No. 5,639,697.

[51] Int. Cl.⁶ ............................ H01L 23/48; H01L 29/00; H01L 23/58
[52] U.S. Cl. ........................ 257/758; 257/752; 257/508; 257/632
[58] Field of Search ................................. 257/752, 758, 257/632, 508

[56] References Cited

U.S. PATENT DOCUMENTS

| | | | |
|---|---|---|---|
| 4,775,550 | 10/1988 | Chu et al. | 427/38 |
| 4,916,514 | 4/1990 | Nowak | 357/68 |
| 5,003,062 | 3/1991 | Yen | 437/231 |
| 5,089,442 | 2/1992 | Olmer | 432/235 |
| 5,173,448 | 12/1992 | Yanagi | 437/186 |
| 5,182,235 | 1/1993 | Eguchi | 437/238 |
| 5,278,105 | 1/1994 | Eden et al. | 437/250 |
| 5,441,915 | 8/1995 | Lee | 437/195 |
| 5,459,093 | 10/1995 | Kuroda et al. | 437/51 |
| 5,461,010 | 10/1995 | Chen et al. | 437/228 |
| 5,470,802 | 11/1995 | Gnade et al. | 437/238 |
| 5,476,817 | 12/1995 | Numata | 438/619 |
| 5,488,015 | 1/1996 | Havemann et al. | 437/195 |
| 5,494,853 | 2/1996 | Lur | 437/195 |
| 5,494,854 | 2/1996 | Jain | 437/195 |
| 5,510,293 | 4/1996 | Numata | 437/195 |
| 5,529,954 | 6/1996 | Iijima et al. | 438/653 |
| 5,604,381 | 2/1997 | Shen | 257/773 |
| 5,618,757 | 4/1997 | Bothra et al. | 438/699 |

OTHER PUBLICATIONS

Wolf, "Silicon Processing for the LVSI Era, vol. 2: Process Integration," Lattice Press, pp. 179–182, 1990.

Ichikawa, et al., "Multilevel Interconnect System for 0.35um CMOS Lsi's with Metal Dummy Planarization Process and This Tugsten Wirings", Jun. 27–29, 1995 VMIC Conference, 1995 ISMIC–104/95/0254.

*Primary Examiner*—Teresa M. Arroyo
*Attorney, Agent, or Firm*—Hickman Stephens & Coleman

[57] ABSTRACT

A method of commonizing the pattern density of topography for different layers of semiconductor wafers to improve the Chemical Mechanical Polishing process used during wafer processing is disclosed. In order to achieve a predetermined pattern density of topography on the surface of a wafer, dummy raised lines are inserted as necessary into gaps between active conductive traces on a trace layer. In some embodiments, the predetermined pattern density is in the range of approximately 40% to 80%. In some applications, both the active conductive traces and the dummy raised lines are formed from a metallic material that is deposited in one single step with an insulating layer deposited over both the active conductive traces and the dummy raised lines prior to the Chemical Mechanical Polishing process. In other applications, the dummy raised lines are formed from the insulating layer.

6 Claims, 4 Drawing Sheets

USE OF DUMMY UNDERLAYERS FOR IMPROVEMENT IN REMOVAL RATE CONSISTENCY DURING CHEMICAL MECHANICAL POLISHING

This application is a divisional of U.S. patent application Ser. No. 08/593,900, filed Jan. 30, 1996, now U.S. Pat. No. 5,639,697.

BACKGROUND OF THE INVENTION

1. Field of Invention

The present invention relates generally to methods of fabricating integrated circuits. More precisely, the use of dummy lines to commonize the pattern densities of integrated circuits is disclosed to improve the removal rate consistency during chemical mechanical polishing.

2. Description of the Prior Art

In the art of fabricating semiconductors, it is important that the surface of a semiconductor wafer be planar in order to meet the requirements of optical projection lithography. Two common techniques used to achieve planarity on a semiconductor surface are a Spin-On Glass (SOG) etchback process and a Chemical Mechanical Polishing (CMP) process. Although both processes improve planarity on the surface of a semiconductor wafer, CMP has been shown to have a higher level of success in improving global planarity. The assurance of planarity is crucial to the lithography process as the depth of focus of the lithography process is often inadequate for surfaces which do not have a consistent height.

A typical CMP process involves the use of a polishing pad made from a synthetic fabric and a polishing slurry which includes pH-balanced chemicals, such as sodium hydroxide, and silicon dioxide particles. Semiconductor wafers are mounted on a polishing fixture such that the wafers are pressed against the polishing pad under high pressure. The fixture then rotates and translates the wafers relative to the polishing pad. The polishing slurry assists in the actual polishing of the wafers. Abrasive forces are created by the motion of the wafer against the polishing pad. While the pH of the polishing slurry controls the chemical reactions, e.g. the oxidation of the chemicals which comprise an insulating layer of the wafer, the size of the silicon dioxide particles controls the physical abrasion of surface of the wafer. The polishing of the wafer is accomplished when the silicon dioxide particles abrade away the oxidized chemicals.

The amount of material polished during the CMP process has been shown to be dependent upon the pattern density of the topography of the layers being polished, i.e. the amount of material polished depends on the concentration of raised areas on the layer being polished. In the art of polishing semiconductor wafers, the polishing time and the downforce exerted on a wafer by a polishing fixture are typically fixed, regardless of the topography of the particular layer being polished. It is well known in the art that the relationship between the removal rate of material during polishing, the downforce exerted on the wafer by a polisher, and the surface area which is polished is best expressed by Preston's law. Preston's law states that the removal rate of material from a wafer is proportional to the downforce exerted on the wafer and inversely proportional to the surface area of the wafer which comes into contact with the polisher. Generally, for a fixed downforce, Preston's law shows that the removal rate of material increases as the polished surface area decreases, and vice versa. As such, the material removal rate during CMP can very well be inconsistent from integrated circuit to integrated circuit, as well as from layer to layer on a single wafer containing at least one integrated circuit, since the concentration of raised areas is typically widely variant from layer to layer.

A typical semiconductor wafer has at least one integrated circuit with a plurality of trace layers which contain a multiplicity of active conductive traces. However, for illustrative purposes, the semiconductor wafers diagrammatically illustrated in FIGS. 1A and 1B include only a single integrated circuit with very few active conductive traces. FIG. 1A is a diagrammatic illustration of the surface of a semiconductor wafer 10 which includes an integrated circuit 20. The trace layer shown on integrated circuit 20 has one raised area 22. A raised area 22 is normally an active conductive trace, which electrically couples associated electrical elements of an integrated circuit 20, on a trace layer over which an insulating layer has been deposited. FIG. 1B is a diagrammatic illustration of the surface of a semiconductor wafer 30 which includes an integrated circuit 40. The layer shown on integrated circuit 40 is comprised of two raised areas 42a and 42b. The illustrations could very well represent different layers of the same wafer and integrated circuit; however, for ease of explanation, they will be considered to represent different wafers which, in this case, contain different integrated circuits. Assuming that wafer 10 and wafer 30 have the same area, and further assuming that integrated circuit 20 is equal in area to integrated circuit 40, it is clear that the topography of integrated circuit 40, which is comprised of two raised areas 42a and 42b, has a higher pattern density than the topography of integrated circuit 20, which is comprised of one raised area 22.

In the CMP process, with a fixed polishing time and a fixed downforce, a greater surface area of material will be polished on wafer 30 than on wafer 10, due to the fact that wafer 30 has a higher concentration of raised areas 42a and 42b which come into contact with a polisher. It follows, from Preston's law, that for a fixed polishing time, the depth of material removed from wafer 30 will be less than the depth of material removed from wafer 10. In other words, if the height of the raised areas 22 and 42 is initially the same, after the CMP process, the height of raised area 22 on wafer 10 will be lower than the height of the raised areas 42a and 42b on wafer 30, as the depth of material removed from raised area 22 is greater than the depth of material removed from raised areas 42a and 42b.

From a process control standpoint, there are many difficulties with the CMP process. Some of these difficulties are due to the fact that the amount of material removed from a wafer during the CMP process is dependent upon several different factors, including the total surface area which is polished and the polishing time. Maintaining consistency in the material removal rate in the CMP process, thereby maintaining a consistent height of raised areas after the CMP process, is crucial both to assure the electrical performance of the integrated circuits being fabricated and to control the process performance of the integrated circuits. The depth of material removed from every layer of every product needs to be consistent in order to maintain a consistent height of raised areas after the CMP process. Occasionally, the polishing time of the CMP process may be adjusted before each layer of a wafer is polished in order to enable the same depth of material to be removed from every layer of every product. The downforce exerted by the polisher may also occasionally be varied in order to control the material removal rate during the CMP process. From a manufacturability standpoint, however, these solutions are less than desirable as both are time-consuming and costly.

Although the conventional CMP process is effective in planarizing the surface of a semiconductor wafer, it would be desirable to find a time and cost efficient method for removing a consistent depth of material from every layer of every product, while utilizing the same CMP process.

SUMMARY OF THE INVENTION

To achieve the foregoing and other objects and in accordance with the purpose of the present invention, dummy raised areas are added to integrated circuits in order to commonize the pattern density of topography from layer to layer of an integrated circuit, as well as from product to product. Underlayers of integrated circuits contain raised areas which are typically active conductive traces over which an insulating layer has been deposited. Active conductive traces are arranged to electrically couple associated elements of integrated circuits on a wafer when processing is completed. The overall surface area of the raised areas, or active conductive traces, in the underlayers of integrated circuits typically varies from layer to layer.

In order to commonize the pattern density of topography from layer to layer of an integrated circuit and from product to product, dummy raised areas are added to the same layers on which active conductive traces are situated. Although dummy raised areas are typically created from a metallic material which may be the same material from which active conductive traces are created, they differ from active conductive traces in that they are not arranged to electrically couple associated elements of an integrated circuit. The total surface area of the dummy raised areas added to a layer of an integrated circuit depends upon the predetermined percentage of pattern density of topography which is desired on the layer.

The dummy raised areas, or lines, may be arranged on an integrated circuit in any suitable pattern. The pattern may be uniform or non-uniform depending upon the particular requirements of an integrated circuit. In some cases, no pattern may be evident. In some embodiments, the dummy raised areas may be formed from a multiplicity of blocks or lines of different shapes and sizes. Alternatively, they may be formed from a multiplicity of dots or other suitable geometries or patterns.

Once a common pattern density of topography is achieved on a plurality of layers of a semiconductor wafer, the polishing time of the Chemical Mechanical Polishing process can be fixed. With a fixed polishing time and a common topography, the surface area of material polished and the depth of material removed, or the overall reduction of height in a layer, during a typical Chemical Mechanical Polishing process is consistent from layer to layer of the wafer.

In a first preferred embodiment of the present invention, the aforementioned predetermined percentage of pattern density of topography is in the range of approximately 40%–80% of the entire surface area of a semiconductor wafer. In a method relating to the first embodiment, both the active conductive traces and the dummy raised areas are formed from a metallic material that is deposited in a single step with the insulating layer being deposited over both. In a second embodiment, the dummy raised areas may be formed from a non-conductive material using a masking technique.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1A:
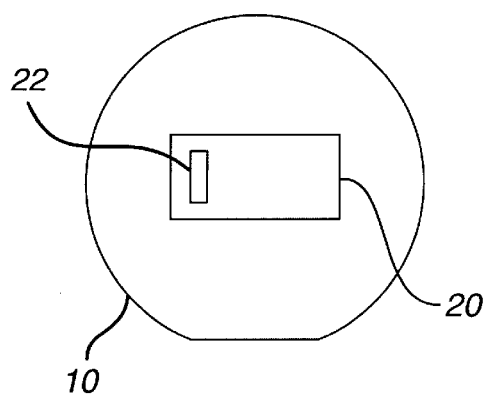
FIG. 1A is a diagrammatic top view of a semiconductor wafer on which an integrated circuit with a raised area is situated.
Figure 1B:
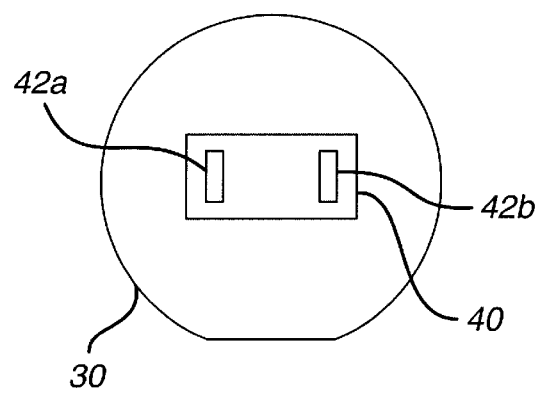
FIG. 1B is a diagrammatic top view of a semiconductor wafer on which an integrated circuit with two raised areas is situated.
Figure 2A:
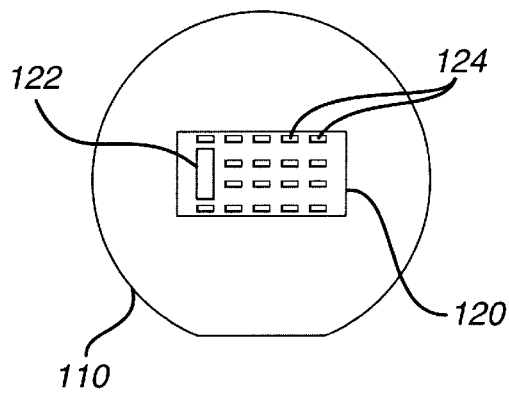
FIG. 2A is a diagrammatic top view of a semiconductor wafer on which a raised area and a multiplicity of dummy raised areas are situated.
Figure 2B:
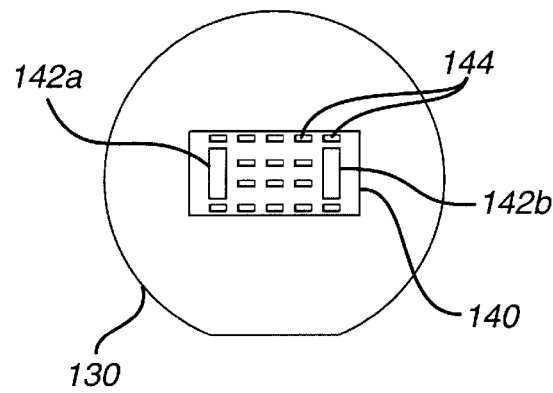
FIG. 2B is a diagrammatic top view of a semiconductor wafer on which an integrated circuit with two raised areas and a multiplicity of dummy raised areas are situated.

The present invention will now be described in detail with reference to a few referred embodiments thereof as illustrated in the accompanying drawings. Referring initially to FIGS. 2A and 2B, there are shown two semiconductor wafers 110 and 130, each with an integrated circuit 120 and 140, respectively, in accordance with a first embodiment of the present invention. The wafers 110 and 130 could easily represent the same wafer, with integrated circuits 120 and 140 representing different layers of the same integrated circuit. They will, however, be referenced as different wafers and integrated circuits for ease of explanation. The layer that is shown of each of the integrated circuits 120 and 140 contains raised areas 122 and 142, respectively. The raised areas 122 and 142 are active conductive traces over which an insulating layer has been deposited. Hence, the raised areas 122 and 142 will be referred to herein as active conductive traces 122 and 142. It should be appreciated by those skilled in the art that semiconductor wafers typically include a plurality of integrated circuits which have trace layers with a plurality of active conductive traces. However, for illustrative purposes, wafers 110 and 130 have been shown with single integrated circuits 120 and 140, respectively, each having very few active conductive traces. Assuming that wafer 110 is equal in area to wafer 130, and further assuming that integrated circuit 120 is equal in area to integrated circuit 140, it is clear that when considering only the surface areas of the active conductive traces 122 and 142, the topography of the layer shown on integrated circuit 140 has a higher pattern density than the topography of the layer shown on integrated circuit 120. The pattern density of topography is defined as the ratio of the overall surface area of raised areas on a wafer surface to the total surface area of the wafer.

The Chemical Mechanical Polishing (CMP) process is commonly used to achieve dielectric planarization of the surfaces of semiconductor wafers. The CMP process has been observed to be effective in improving the global planarity of wafer surfaces. Conventionally, the polishing time of the CMP process remains fixed at least for all layers of the same integrated circuit, as varying the polishing times for each layer is time-consuming and expensive from a manufacturability standpoint. The surface area of material polished on a specific layer depends critically upon the pattern density of the topography of that particular layer. As is well known to those skilled in the art, Preston's law gives a relationship between the removal rate of material, the downforce exerted on a wafer by a polisher, and the polished area of contact of the wafer, which is dependent on the topography of the layer being polished. Preston's law states that the removal rate of material during the CMP process is proportional to the downforce exerted on the wafer and inversely proportional to the polished area of contact. For example, during the CMP process, the surface area of material polished on wafer 110 will be less than the surface area of material polished when wafer 130 undergoes the same process, if active conductive traces 122 and 142 are the only surfaces which come in contact with the polisher. If both the downforce exerted by the polisher and the polishing time are fixed, it follows that by virtue of Preston's law, the depth of material removed during the CMP process from the layer shown on wafer 110 is greater than the depth of material removed from the layer shown on wafer 130.

As is often the case in the process of semiconductor fabrication, there can be significant variations in the topographies of different unplanarized layers of semiconductor wafers. Commonizing the pattern densities of the topographies of different layers allows the polish time of the CMP process, as well as the downforce of a polisher, to be substantially the same for all layers, while allowing for substantially the same surface area of material to be polished on all layers. In addition, commonizing the pattern densities of topography also facilitates the creation of a set of fixed CMP processes. By way of example, a set of fixed CMP processes may include one CMP process which is fixed for surfaces with a 40% pattern density, and one which is fixed for surfaces with a 80% pattern density. Since some products may benefit from layers with high pattern densities while others, due to capacitative problems, may benefit from layers with slightly lower pattern densities, it may be desirable to permit the implementation of several fixed pattern densities. It follows that the creation of an easily implemented set of fixed CMP processes would then serve to allow the same depth of material to be removed from every layer of every wafer.

In the first embodiment as shown, a plurality of dummy raised areas 124 and 144 have been added to integrated circuits 120 and 140, respectively. The plurality of dummy raised areas 124 and 144 serve to commonize the pattern density of the topography of the layers shown on integrated circuits 120 and 140. In addition to commonizing topography, the dummy raised areas 124 and 144 also serve to achieve a predetermined percentage of pattern density on the layers shown of integrated circuits 120 and 140. It should be clear that it is possible to commonize the topographies between the layers shown on integrated circuits 120 and 140 without adding dummy raised areas 144 to integrated circuit 140 at all. That is, all of the layers of a single wafer or a plurality of wafers may be adjusted to match the layer with the highest pattern density. Reducing the number of dummy raised areas added to an integrated circuit to the minimum amount necessary to commonize topographies between integrated circuits is sufficient to allow the CMP process to maintain a fixed material removal rate for a fixed downforce exerted on the wafers containing the integrated circuits. Achieving a predetermined percentage of pattern density of topography, however, allows the material removal rate of the CMP process to be fixed globally along with the downforce, as every layer of every semiconductor wafer which utilizes a particular polisher would have the same surface area to polish. Further, fixing the polish time would then clearly lead to the same depth of material being removed from every layer of every wafer. Typically, in order to commonize the pattern density of topography over many different products, including those with an inherently high pattern density, a predetermined percentage of pattern density that falls in the range of approximately 40% to 80% of the overall surface area of a wafer has been found to work well.

The dummy raised areas 124 and 144 have been shown in this embodiment as blocks which have the same shape and surface area. However, it should be apparent to those skilled in the art that the dummy raised areas 124 and 144 may take any suitable form. By way of example, the dummy raised areas may be blocks, line segments, or dots of different shapes and sizes. Also, the dummy raised areas 124 and 144 may be scattered about the surface of the integrated circuits 120 and 140, respectively, in a nonuniform pattern. The dummy raised areas 124 and 144 have been shown in this embodiment as having a uniform pattern purely for ease of illustration.

Figure 3A:
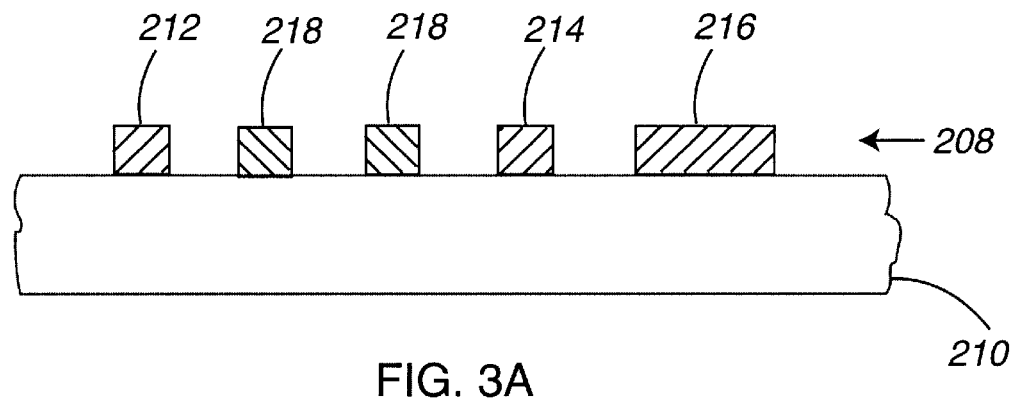
FIGS. 3A–C are diagrammatic side views of a wafer segment which illustrate the steps in creating dummy raised lines from a metallic material in accordance with the first preferred embodiment of the present invention.
Figure 3B:
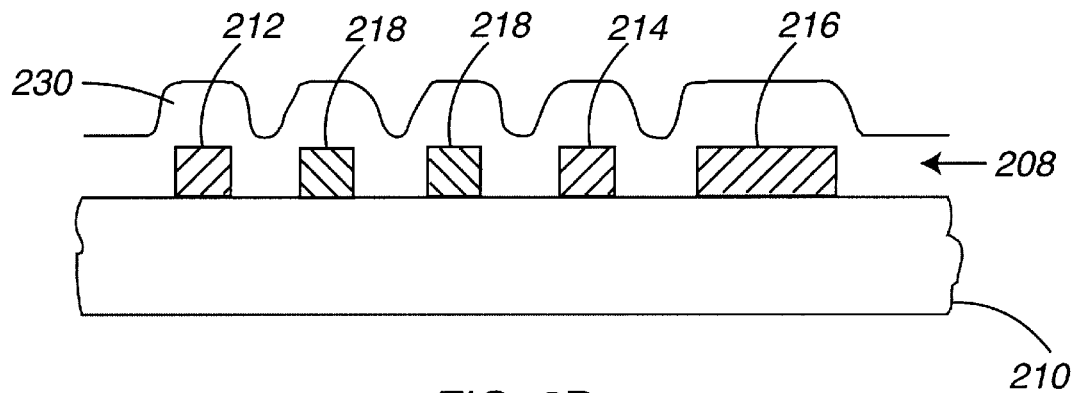
Figure 3C:
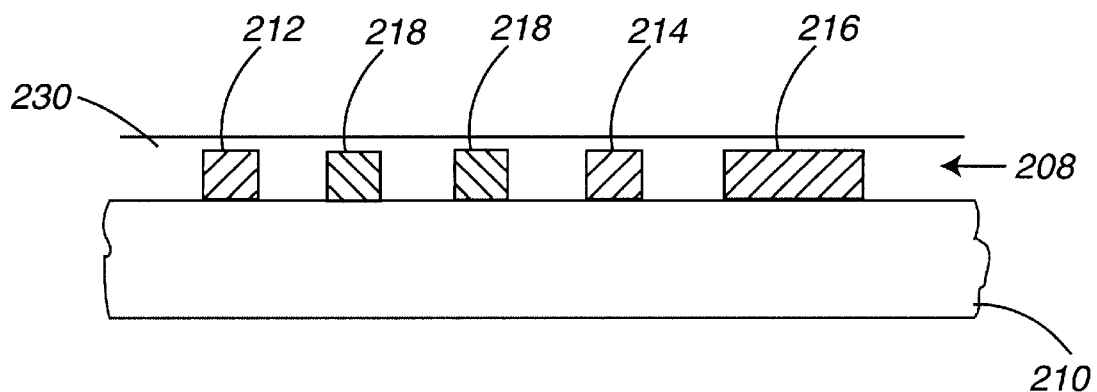

Referring next to FIGS. 3A–C, a method of forming dummy raised areas will be described. FIGS. 3A–C are diagrammatic side views of a wafer segment on which raised surfaces are situated on the same layers as active conductive traces. In this method, dummy raised lines 218 are interspersed among active conductive traces 212, 214, 216 on the trace layer 208 of a semiconductor substrate 210 as illustrated in FIG. 3A. The number of dummy raised lines 218, as well as the surface area of dummy raised lines 218, added to a semiconductor substrate 210 depends upon the percentage of pattern density of topography desired. Herein, the phrases "dummy raised line" and "dummy raised area" will be used interchangeably and should be construed as having the same meaning. Both refer to raised areas which are three-dimensional. The active conductive traces 212, 214, 216 are created from a metallic material and are arranged to electrically couple associated elements of integrated circuits (not shown) on the semiconductor substrate 210. The dummy raised lines 218 differ from the active conductive traces 212, 214, 216 in that they are not arranged to electrically couple associated elements of integrated circuits (not shown). To minimize processing, the dummy raised lines 218 and the active conductive traces 212, 214, 216 are ordinarily created from the same material and applied at the same step. However, the dummy raised lines 218 may be created from a material which is different from the material used to create the active conductive traces 212, 214, 216. An insulating layer 230, typically an oxide layer, is deposited over the dummy raised lines 218 and the active conductive traces 212, 214, 216 as illustrated in FIG. 3B, in order to electrically insulate the active conductive traces 212, 214, 216. Once the insulating layer 230 has been deposited, it is polished by a CMP process. The CMP process results in a planar surface being created from the insulating layer 230 as illustrated in FIG. 3C.

Figure 4A:
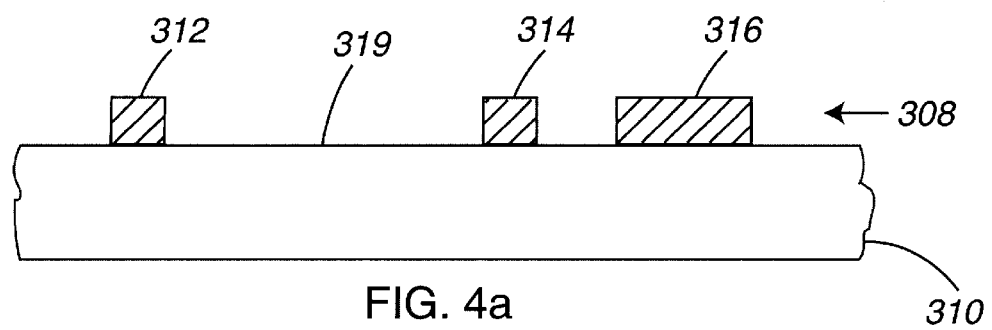
FIGS. 4a–e are diagrammatic side views of a wafer segment which illustrate the steps in creating dummy raised lines from an insulating layer in accordance with a second preferred embodiment of the present invention.
Figure 4B:
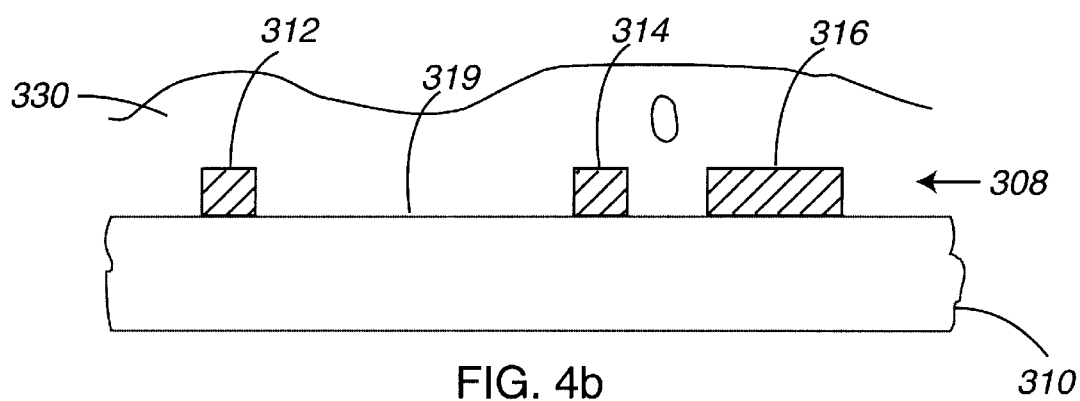
Figure 4C:
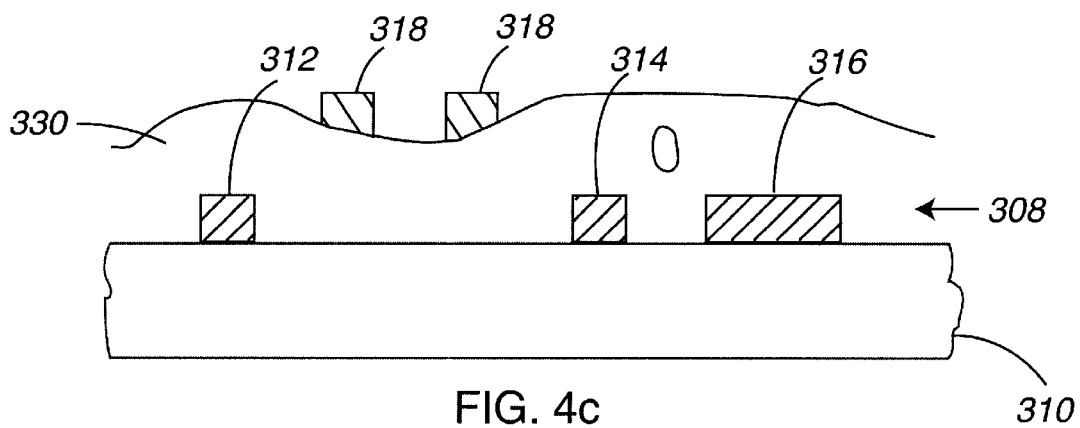
Figure 4D:
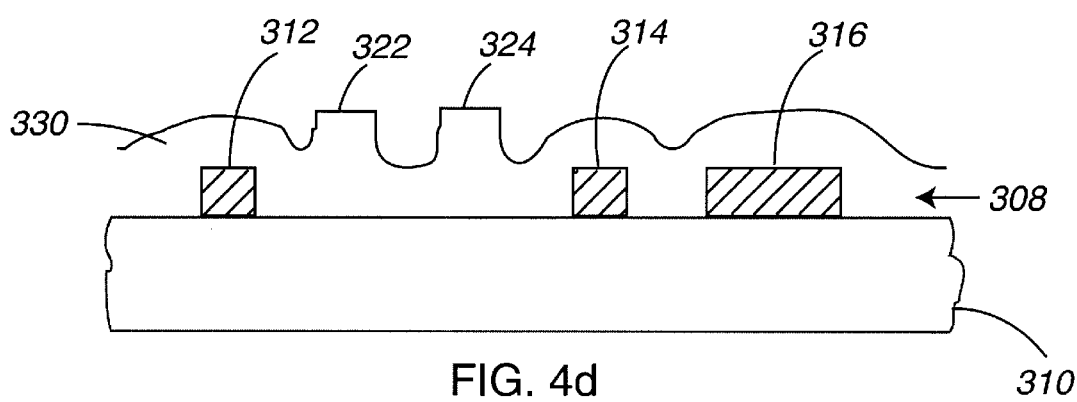
Figure 4E:
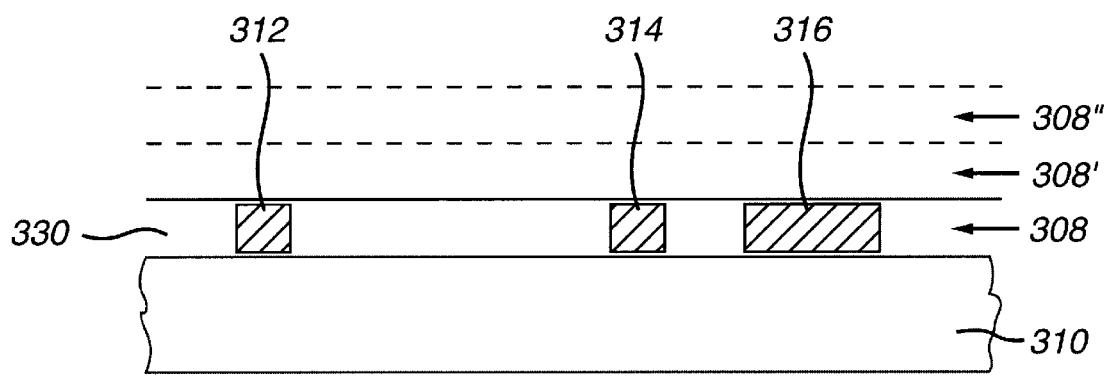

FIGS. 4a through 4d are diagrammatic side views of a second preferred embodiment of the present invention; this embodiment relates to the creation of dummy raised areas in the insulating layer on the surface of an integrated circuit. In this embodiment, raised lines are created first by depositing a thicker insulating layer 330 than normally used over active conductive traces 312, 314, 316 on a trace layer 308 situated on a semiconductor substrate 310, as illustrated in FIG. 4b. The insulating layer 330 should be thick enough to at least sufficiently fill in the gaps 319, 320 between the active conductive traces 312, 314, 316. Second, a mask 318, (created from a photoresist material in this embodiment) is placed over the insulating layer 330 in sections where dummy raised lines are desired (such as gap 319 between active conductive traces 312 and 314) as illustrated in FIG. 4c. Next, the insulating layer 330 is subjected to an etching process, and the mask 318 is removed, leaving dummy raised lines 322, 324 created from the insulating layer as illustrated in FIG. 4d. The dummy raised lines 322, 324 are created underneath where the mask 318 was placed, due to the fact that the mask prevents etching of the insulating layer 330 from occurring underneath it, while the remainder of the insulating layer 330 is etched. Last, the insulating layer 330 is polished by a CMP process to provide a planar surface over the trace layer 308, as shown in FIG. 4e.

Although only a few embodiments of the present invention have been described, it should be understood that the present invention may be embodied in many other specific forms without departing from the spirit or the scope of the invention. In particular, dummy underlayers may be implemented for use with any polishing process which would benefit from a consistent material removal rate from layer to layer or from product to product. Also, although the predetermined percentage of pattern density of topography in the present invention is in the range of approximately 40%–80%, the percentage can clearly be raised and lowered without departing from the spirit or scope of the invention. The goal is to commonize a plurality of layers for a plurality of products by creating substantially the same pattern density of topography on a plurality layers as suggested by a plurality of additional trace layers 308' and 308" formed over trace layer 308 (FIG. 4e). As such, the actual percentage of pattern density of topography is less important than a consistent pattern density.

The present invention relates to commonizing the pattern density of topography for a plurality of layers for different integrated circuit products by adding dummy raised lines to trace layers or insulating layers of semiconductor wafers. It should be clear that dummy raised lines may be added to a single layer of a wafer in order to achieve a desired pattern density of topography on that layer alone.

Although the actual material removal rate has not been discussed, it will be appreciated by those skilled in the art that the actual material removal rate of the CMP process depends upon what is desired in a semiconductor fabrication process. There are no limits placed on the material removal rate because the limits are not critical to the present invention. Similarly, limits have not been placed on either the polishing time or the downforce exerted on a wafer by a polisher as, again, the limits are not critical to the present invention. However, it should be noted that limits may be imposed as required for any particular application. Therefore, the present examples are to be considered as illustrative and not restrictive, and the invention is not to be limited to the details given herein, but may be modified within the scope of the appended claims.

We claim:

1. A wafer having at least one integrated circuit, the wafer being formed in accordance with a method comprising the steps of:

forming a first active layer having a multiplicity of active conductive traces on a surface of a substrate of the wafer, the active conductive traces each being arranged to electrically couple associated elements of an associated integrated circuit on the wafer, there being gaps between adjacent ones of the active conductive traces;

determining a uniform pattern density for the surface of the wafer;

forming a multiplicity of dummy raised lines on the surface of the substrate in the gaps, wherein the dummy raised lines are not arranged to electrically couple any elements in the integrated circuit, the multiplicity of dummy raised lines and the multiplicity of active conductive traces having said uniform pattern density over the surface of the substrate;

depositing an insulating layer over the active conductive traces to electrically insulate the active conductive traces;

polishing the surface of the insulating layer to provide a planar surface on the wafer, whereby the dummy raised lines cooperate with the active conductive traces to improve standardized polishing of the wafer; and forming a plurality of additional active layers over said first active layer by repeating the foregoing steps for forming said first active layer, each of the additional active layers having substantially said uniform pattern density of said first active layer.

2. The wafer of claim 1, wherein the wafer is diced to form a plurality of integrated circuits.

3. The wafer of claim 1, wherein the uniform pattern density is 40% to 80% of an overall surface area of the first active layer.

4. An integrated circuit device comprising:

a plurality of active layers formed over a substrate, wherein each active layer includes:

a multiplicity of spaced apart active conductive traces arranged to electrically couple associated elements of an integrated circuit, said active conductive traces each being formed on a base surface and having a top surface above said base surface;

a multiplicity of dummy raised lines situated between said active conductive traces, said dummy raised lines not being arranged to electrically couple any elements of said integrated circuit, said dummy raised lines each being formed on said base surface and having a top surface above said base surface, the combination of said dummy raised lines and said active conductive traces having a substantially uniform pattern density covering 40% to 80% of an overall surface area of said substrate over which said dummy raised lines and said active conductive traces are disposed, and an insulating layer over said active conductive traces to electrically insulate said active conductive traces, at least some of said insulating layer contacting said base surface, said insulating layer having a smoothed, substantially planar surface formed by a sttandardized polishing process.

5. The integrated circuit device of claim 4, wherein the substrate is a semiconductor wafer.

6. The integrated circuit device of claim 4, wherein the dummy raised lines are at least partially formed of elements selected from the group consisting of dots, blocks, line segments, and combinations thereof.

* * * * *